(12) United States Patent
Haibara (10) Patent No.: US 8,408,221 B2
(45) Date of Patent: Apr. 2, 2013

(54) MICRO BUBBLE GENERATING DEVICE AND SILICON WAFER CLEANING APPARATUS

(75) Inventor: Teruo Haibara, Yamaguchi (JP)

(73) Assignee: Siltronic AG, Munich (DE)

( * ) Notice: Subject to any disclaimer, the term of this patent is extended or adjusted under 35 U.S.C. 154(b) by 318 days.

(21) Appl. No.: 12/633,914

(22) Filed: Dec. 9, 2009

(65) Prior Publication Data

US 2010/0163084 A1   Jul. 1, 2010

(30) Foreign Application Priority Data

Dec. 25, 2008   (JP) ................. 2008-330560

(51) Int. Cl.
*B08B 3/12* (2006.01)

(52) U.S. Cl. ............. 134/102.2; 134/100.1; 134/102.1; 134/184; 134/902

(58) Field of Classification Search ........... 134/100.1, 134/102.1, 102.2, 902, 184; 239/428.5
See application file for complete search history.

(56) References Cited

U.S. PATENT DOCUMENTS

| | | | | |
|---|---|---|---|---|
| 4,394,289 A * | 7/1983 | Brown et al. | ........... | 366/101 |
| 4,790,944 A * | 12/1988 | Gordon et al. | ........... | 210/706 |
| 5,314,644 A * | 5/1994 | Michelsen et al. | ........... | 261/84 |
| 5,451,267 A * | 9/1995 | Stadler et al. | ........... | 134/30 |
| 6,142,456 A * | 11/2000 | Machiya et al. | ........... | 261/76 |
| 6,200,486 B1 * | 3/2001 | Chahine et al. | ........... | 210/748.03 |
| 6,395,175 B1 * | 5/2002 | Gao et al. | ........... | 210/610 |
| 7,159,854 B2 * | 1/2007 | Lee et al. | ........... | 261/28 |
| 7,677,202 B2 * | 3/2010 | Takahashi et al. | ........... | 119/665 |
| 7,726,325 B2 * | 6/2010 | Saiki et al. | ........... | 134/184 |
| 7,913,984 B2 * | 3/2011 | Noguchi et al. | ........... | 261/29 |
| 2005/0077636 A1 * | 4/2005 | Bortkevitch et al. | ........... | 261/76 |
| 2006/0137719 A1 | 6/2006 | Hasegawa et al. | | |
| 2007/0108640 A1 * | 5/2007 | Takahashi et al. | ........... | 261/76 |
| 2007/0223916 A1 | 9/2007 | Higuchi et al. | | |
| 2010/0193445 A1 * | 8/2010 | Livshits et al. | ........... | 210/703 |

FOREIGN PATENT DOCUMENTS

| | | | |
|---|---|---|---|
| DE | 100 08 005 | * | 8/2000 |
| EP | 1 858 059 A1 | | 11/2007 |
| JP | 56-028695 | * | 3/1981 |
| JP | 56-157928 | * | 12/1981 |
| JP | 63-086525 | * | 4/1988 |

(Continued)

OTHER PUBLICATIONS

Tsuyoshi Hattori, "New Edition of Cleaning Technology of Silicon Wafer Surface" Realizy Science & Engineering (2000), including English Abstract.

*Primary Examiner* — Michael Barr
*Assistant Examiner* — Benjamin L Osterhout
(74) *Attorney, Agent, or Firm* — Brooks Kushman P.C.

(57) ABSTRACT

A micro-bubble generating device is provided with a micro-bubble generating mechanism and a leading conduit provided with a widening section and a tube part, the widening section and the tube part in communication with each other in the leading conduit. The widening section has a hollow shape which has an axis Z as a central axis, and has base surfaces and a peripheral surface, and communicates with a nozzle of the micro-bubble-generating mechanism via one base surface of the widening section, and communicates with the tube part via the other base surface. The cross section orthogonal to a flow axis Z of the micro-bubbles of the widening section is larger than the cross section orthogonal to the flow axis Z of the tube part.

9 Claims, 7 Drawing Sheets

FOREIGN PATENT DOCUMENTS

| | | | |
|---|---|---|---|
| JP | 01008630 A | | 1/1989 |
| JP | 04-244120 | * | 9/1992 |
| JP | 05-245179 | * | 9/1993 |
| JP | 11-319637 | * | 11/1999 |
| JP | 2000000447 A | | 1/2000 |
| JP | 2000-093772 | * | 4/2000 |
| JP | 2004-283683 A | | 10/2004 |
| JP | 2005093873 A | | 4/2005 |
| JP | 2007-069071 | * | 3/2007 |
| JP | 2007-190466 | * | 8/2007 |
| JP | 2008-023435 | * | 2/2008 |
| JP | 2008-023515 | * | 2/2008 |
| JP | 2008-093577 A | | 4/2008 |
| JP | 2008-098430 A | | 4/2008 |
| JP | 2008103701 A | | 5/2008 |
| JP | 2008-149209 | * | 7/2008 |
| JP | 2008198974 A1 | | 8/2008 |
| JP | 2008-237956 | * | 10/2008 |
| KR | 2002048056 | * | 6/2002 |
| KR | 2003070559 | * | 8/2003 |
| KR | 1020040069650 A | | 8/2004 |
| WO | 2008087903 A1 | | 7/2008 |

* cited by examiner

MICRO BUBBLE GENERATING DEVICE AND SILICON WAFER CLEANING APPARATUS

CROSS-REFERENCE TO RELATED APPLICATIONS

This application claims priority to Japanese Patent Application No. 2008-330560 filed Dec. 25, 2008, which is herein incorporated by reference.

BACKGROUND OF THE INVENTION

1. Field of the Invention

The present invention relates to a micro-bubble generating device and a silicon wafer cleaning apparatus comprising the micro-bubble generating device.

2. Background Art

In recent years, in manufacturing semi-conductor LSI using a silicon wafer, wafers having larger diameters and finer processing technology are increasingly needed. Furthermore, problems related to maintaining and enhancing product quality accompanying more complicated fabrication processes and related to production cost reduction, etc. have also become problematic.

Particularly in many fields of semi-conductor LSI manufacturing technology using silicon wafers, a so-called a wet treatment process including treatments by various solutions has become an essential part of the manufacturing process. Important processes among such wet treatment processes are cleaning processes and etching processes, etc. In these wet treatment processes, conventional improvements are mostly directed to selecting a solution type, a density, a treatment temperature, a time frame, etc. (For example, see Tsuyoshi Hattori "New Edition of Cleaning Technology of Silicon Wafer Surface" Realyze Science & Engineering (2000).) However, these conventional technologies were not sufficient to fulfill requirements associated with further fine processing technologies in recent years, the more complicated processes, high cleanliness, and cost reduction. Furthermore, in recent years, treatments by dilute chemical cleaning and chemical-solution-less cleaning, etc. have been desired due to requirements with respect to tightening environmental protection measures and cost reduction of waste liquid treatment.

Use of micro-bubbles in semi-conductor cleaning has been promoted in recent years; for example, see Japanese Unexamined Patent Application Publication No. 2008-103701. However, in the conventional cleaning apparatus using micro-bubbles, since the nozzle of the micro-bubble generating device is located in the bottom of the cleaning bath, and since the micro-bubble generating device occupies a large space in the cleaning bath, micro-bubble generating devices became obstructive to the installation of other devices, and the installation of the micro-bubble generating device took time and effort. In order to solve these problems, a cleaning apparatus in which a buffer tank apart from the cleaning bath containing the micro-bubble generating device has been disclosed. However, such a cleaning apparatus requires a larger installation space. Accordingly, an inline-disposition in which the micro-bubble generating device is disposed in a conduit for circulating a cleaning fluid in the cleaning bath is preferred, and such a cleaning apparatus having the inline-disposed micro-bubble generating device have been conventionally used.

However, if a micro-bubble generating device is installed in a narrow conduit, the micro-bubbles coalesce around the nozzle of the micro-bubble generating device, and the resultant bubble size is thus large. Particularly, in the case of the micro-bubble generating devices generating a vortex flow, the bubbles are brought together in the center of the conduit by a Coanda effect due to the vortex flow, and the bubble size is thus made larger. Accordingly, in a conventional cleaning apparatus, there was the problem that generating efficiency of the micro-bubble apparatus was decreased and the cleaning of the silicon wafer was compromised.

SUMMARY OF THE INVENTION

An object of the present invention is to provide a micro-bubble generating device and a silicon wafer cleaning apparatus which can enhance the generation efficiency of micro-bubbles and enhance cleaning of the silicon wafer. These and other objects are achieved by a micro-bubble generating device comprising:

a micro-bubble generating mechanism generating micro-bubbles; and a conduit connected to the micro-bubble generating mechanism to conduct the micro-bubbles generated by the micro-bubble generating mechanism, wherein the micro-bubble generating mechanism is provided with a nozzle which emits micro-bubbles, and the conduit is provided with a widening section in communication with a tube part, the widening section being larger than the tube part in a flow sectional area, wherein the micro-bubble generating mechanism is connected to the widening section.

DETAILED DESCRIPTION OF THE PREFERRED EMBODIMENTS

Preferably, the micro-bubble generating mechanism and the tube part are connected to the widening section so that a flow axis of the micro-bubble in the widening section and the flow axis of the micro-bubble in the tube part are extended mutually in the same direction. More preferably, the flow direction of the micro-bubbles in the widening section and the flow direction of the micro-bubbles in the tube part are opposed.

The micro-bubble generating mechanism and the tube part are preferably connected to the widening section such that the flow axis of the micro-bubbles in the widening section and the flow axis of the micro-bubbles in the tube part cross mutually.

Yet more preferably, the micro-bubble generating mechanism and the tube part are connected to the widening section such that the flow axis in the widening section and the flow axis in the tube part are orthogonal.

Preferably, the micro-bubble generating mechanism is connected to the widening section such that the nozzle deviates from a flow-passage-axis line of the micro-bubbles in the tube part.

The widening section preferably has a circular flow passage cross section, and the tube part is preferably situated near the nozzle in the widening section.

A silicon wafer cleaning apparatus according to the present invention is a silicon wafer cleaning apparatus provided with the micro-bubble generating device disclosed above and cleans a silicon wafer, and comprises:

a cleaning bath accommodating the silicon wafer to be cleaned and containing a cleaning fluid; and a pump device having a pump and a conduit circulating the cleaning fluid in the cleaning bath, wherein the micro-bubble generating device is provided in the conduit of the pump device.

In the micro-bubble generating device according to the present invention, since the micro-bubble generating mechanism generating the micro-bubbles is connected to a widening section having a larger flow passage sectional area than that of the tube part in the conduit for directing the generated micro-bubble, the micro-bubbles emitted from the nozzle of the micro-bubble generating device disperse in the widening section without mutually interfering. Accordingly, the generated micro-bubbles are prevented from coalescing to become a bubble of large size, for which the cleaning effect is low as is conventional, and the generated micro-bubbles maintain bubble size and stabilize in the widening section. The micro-bubbles with small size which are high in cleaning efficiency can then be supplied through the tube part. Thus, in the micro-bubbles generating device according to the present invention, micro-bubbles with small size and high cleaning efficiency can be supplied to the cleaning bath, the efficiency of micro-bubbles generation can be enhanced, and cleaning performance can be enhanced as well.

Further, the micro-bubble generating device according to the present invention is simple in its structure, can occupy a small space, and can enhance the flexibility of the disposition thereof in applicable devices, for example, the cleaning apparatus for silicon wafers. Furthermore, in the silicon wafer cleaning apparatus according to the present invention, the cleaning performance can be enhanced. Further, the apparatus can be miniaturized and the flexibility of the apparatus design can be enhanced.

Hereinafter, embodiments according to the present invention will be described in detail with reference to figures.

Figure 1A:
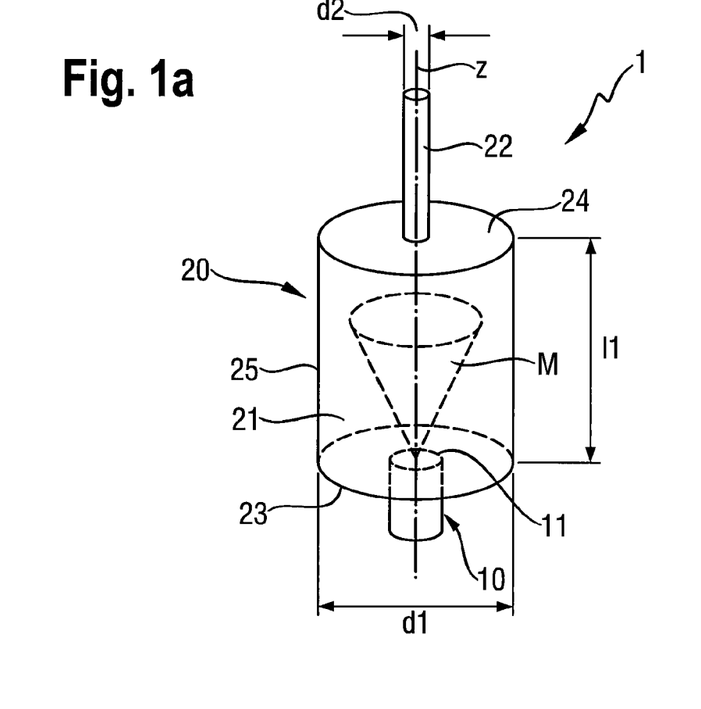
FIGS. 1A and 1B illustrate a schematic configuration of a micro-bubble generating device according to a first embodiment of the present invention, FIG. 1A in perspective, and FIG. 1B as a front view.
Figure 1B:
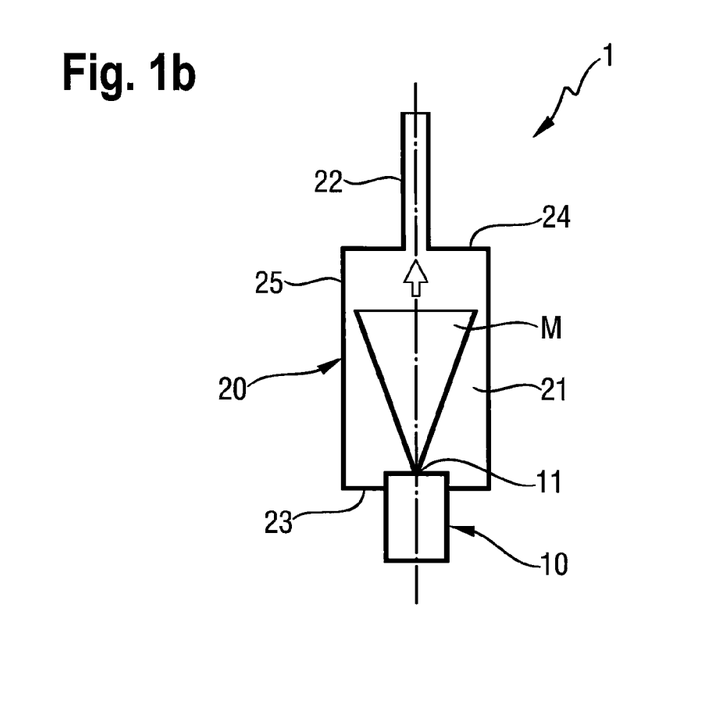

FIGS. 1A and 1B is a schematic configuration of a micro-bubble generating device according to a first embodiment of the present invention, FIG. 1A is a perspective view and FIG. 1B is a front view.

As illustrated in FIGS. 1A and 1B, the micro-bubble generating device 1 according to the first embodiment of the present invention is provided with a micro-bubble generating mechanism 10 which generates a micro-bubble M, and a leading conduit 20 for leading the micro-bubble M generated by the micro-bubble generating mechanism 10 outside the generator.

The micro-bubble generating mechanism 10 is provided with a nozzle 11 for emitting the generated micro-bubbles. The micro-bubble generating mechanism 10, to which a fluid and a gas are supplied, emits fine bubbles having a diameter on the order of $\mu$m together with the fluid. As for the micro-bubble generating mechanism 10, one which is accompanied by a flow of the fluid when the micro-bubble is generated is preferable. For example, preferable are those such as a swirling liquid flow type, a static mixer type, an ejector type, a cavitation type, a venturi type, a combination of a centrifugal pump and a swirling flow type micro-bubble generator, and one using a pressure dissolving type micro-bubble generating method. This is because the fluid containing the generated micro-bubble needs to be carried subsequently to a cleaning bath for silicon wafer cleaning apparatus, and in the case where micro-bubble generation is accompanied by fluid flow, an additional transport device or the like for conveying the micro-bubbles to the cleaning bath can be omitted. However, the micro-bubble generating mechanism 10 may be one which is not accompanied by the flow of the fluid in generating the micro-bubbles, and may be one in which the fluid is standing still ("stagnant"). In this case, in the silicon wafer cleaning apparatus, a transport device for conveying the fluid containing the micro-bubbles to the cleaning bath will be needed. As the micro-bubble generating mechanism 10 which is not accompanied by the flow of the fluid in generating the micro-bubbles and in which the fluid is stagnant, there are fine pore types, rotating types, ultrasonic types, steam condensation types, and those using an electrolysis-type micro-bubble generating method.

The leading conduit 20 is provided with a widening section 21 and a tube part 22. The widening section 21 and the tube part 22 are connected to and communicate mutually in the leading conduit 20. The micro-bubble generating mechanism 10 which is connected to the widening section 21 emits the micro-bubble M expanding from the nozzle 11 into the widening section 21 in a conical shape with an axis Z as a central axis.

The widening section 21 which is preferably in hollow cylindrical form with the axis Z as the central axis, has base surfaces 23 and 24 and a cylindrical peripheral surface 25, and communicates with the nozzle 11 of the micro-bubble generating mechanism 10 via one base surface 23 of the widening section 21 and communicates with the tube part 22 via the other base surface 24. The nozzle 11 of the micro-bubble generating mechanism 10 is preferably a cylindrical opening with the axis Z as the central axis, and the tube part 22 is preferably a cylindrical tube with the axis Z as the central axis. That is, in the micro-bubble generating device 1, a flow passage axis of the micro-bubble flowing in the widening section 21 and a flow passage axis of the micro-bubble flowing in the tube part 22 are the identical axis Z, and the micro-bubbles are made to flow in the identical direction.

In the leading conduit 20, an area of the micro-bubble flow passage cross section of the widening section 21, i.e., the area of the cross section orthogonal to the axis Z which is the flow passage axis of the micro-bubbles, is larger than the area of the micro-bubble flow passage cross section of the tube part 22, i.e., the area of the cross section orthogonal to the axis Z which is the micro-bubble flow passage axis. Further, the area of the flow passage cross section of the widening section 21 is larger than the area of the cross section (flow passage cross section) orthogonal to the axis Z of the nozzle 11 of the micro-bubble generating mechanism 10. Furthermore, the area of the flow passage cross section of the widening section 21 and the length thereof in the direction of the flow passage axis Z is configured to allow the micro-bubbles emitted from the micro-bubble generating mechanism 10 to diffuse and stabilize while maintaining the bubble size.

The size of widening section 21 differs corresponding to the flow rate of the fluid supplied to the micro-bubble generating mechanism 10, the type, density or temperature of the fluid to be supplied, the flow rate of the gas to be supplied to the micro-bubble generating mechanism 10, or to specification of the micro-bubble generating mechanism 10, or the like. As specification for the micro-bubble generating mechanism 10, these may include the type of generating method, the size of the micro-bubbles, the bubble generation efficiency, or the like.

For example, the diameter d1 of the flow passage cross section of the widening section 21 may be 50 to 500 mm, preferably 75 to 300 mm and more preferably 100 to 200 mm. The length 11 of the widening section 21 in the axial Z direction is 50 to 500 mm, preferably 75 to 400 mm and more preferably 100 to 300 mm. The capacity of the widening section 21 may be 0.1 to 50 l (liter), preferably 0.2 to 10 l and more preferably 0.5 to 5 l. A ratio of the diameter of the flow passage cross section of the widening section 21 to the diameter of the flow passage cross section of the nozzle 11 may be 10 to 100 times, preferably 15 to 80 times and more preferably 20 to 60 times, in micro-bubble generating mechanisms of the swirling liquid flow type, in which the diameter of the nozzle is comparatively small and which emits the micro-bubble in a spray state (conical shape). In micro-bubble generating mechanisms of the ejector type, in which the diameter of the nozzle is comparatively large and which emits the micro-bubbles as the shape of the nozzle, the ratio of the diameter of the flow passage cross section of the widening section 21 to the diameter of the flow passage cross section of the nozzle 11 may be 1.5 to 50 times, preferably 2 to 40 times and more preferably 3 to 30 times. As for the diameter d2 of the flow passage cross section of the tube part 22, a value suitable for the flow rate of the fluid in the widening section 21 may simply be selected.

It should be noted that the size of the widening section 21 is not limited to those mentioned above, and is selected corresponding to above-mentioned specific conditions. In the case that the diameter d1 of the widening section 21 is too small, the length 11 of widening section 21 is too short, or the capacity of the widening section 21 is too small, the generated bubble size may become large. In the case that the diameter d1 of the widening section 21 is too large, the length 11 of the widening section 21 is too long or the capacity of the widening section 21 is too large, a wider space for installation of the micro-bubble generating device 1 will be needed, and at the same time, the fluid usage will increase. It is preferable that the size of the widening section 21 is selected taking such matters into consideration.

Thus, in the micro-bubble generating device 1 according to the first embodiment of the present invention, the micro-bubble generating mechanism 10 is connected to the tube part 22 having the small flow passage via the widening section 21 having the large flow passage of the leading conduit 20, and the micro-bubbles generated by the micro-bubble generating mechanism 10 are emitted first into the widening section 21 in which the flow passage sectional area is large. Accordingly, the micro-bubbles can diffuse without colliding with the conduit wall, and do not coalesce into bubbles with a large size by mutually interfering, and can diffuse until stabilization thereof is realized within the fluid in the widening section 21 while maintaining the same small bubble size as the size at the time of emission. Accordingly, the micro-bubbles which have maintained the same small bubble size as the size at the time of emission and which have a high cleaning effect can be supplied from the widening section 21 to the tube part 22, and micro-bubbles having the small bubble size can be led elsewhere.

The micro-bubble generating device 1 is composed of the micro-bubble generating mechanism 10 and the leading conduit 20 having the widening section 21 and the tube part 22, and is simple in the configuration thereof.

Thus, the micro-bubble generating device 1 according to the first embodiment of the present invention can provide micro-bubbles of small bubble size having a high cleaning effect. Further, the micro-bubble generating device 1 is simple in structure, and thereby enables a device to be miniaturized.

It should be noted, that in the micro-bubble generating device 1 according to the present embodiment, although the shape of the widening section 21 is preferably a hollow cylinder, the shape is not limited to this. For example, the widening section 21 may be a hollow rectangular parallelepiped type.

Figure 2:
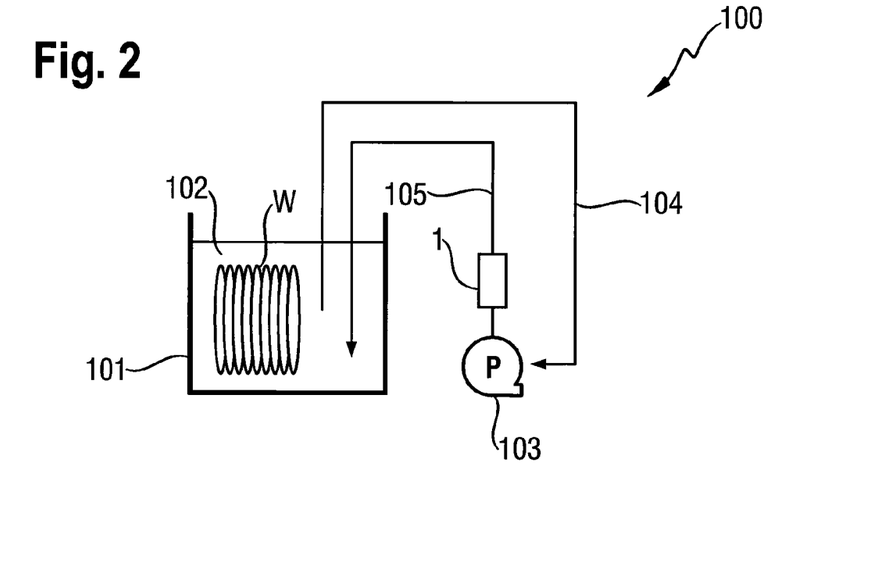
FIG. 2 illustrates a schematic configuration of a silicon wafer cleaning apparatus provided with the micro-bubble generating device of FIG. 1.

Subsequently, a silicon wafer cleaning apparatus provided with the micro-bubble generating device 1 according to the first embodiment of the present invention will be described. FIG. 2 illustrates a schematic configuration of the silicon wafer cleaning apparatus provided with the micro-bubble generating device 1.

As illustrated in FIG. 2, the silicon wafer cleaning apparatus 100 is provided with a cleaning bath 101 in which a cleaning fluid 102 is contained, a pump 103 and conduits 104, 105 for circulating the cleaning fluid 102 in the cleaning bath 101. The pump 103 removes the cleaning fluid 102 from the cleaning bath 101 via the conduit 104, and supplies the cleaning fluid 102 to the cleaning bath 101 via the conduit 105. The silicon wafer cleaning apparatus 100 is provided with the micro-bubble generating device 1. The micro-bubble generating device 1 is located in a mid-portion of the conduit 105.

In the following, a cleaning treatment of the silicon wafer W in the silicon wafer cleaning apparatus 100 will be described.

For example, a plurality of silicon wafers W cut from a single crystal silicon ingot are disposed in a holder (not shown) in a manner that surfaces of the wafers face mutually at equal intervals, and are disposed in the cleaning bath 101 and then soaked in the cleaning fluid 102 stored in the cleaning bath 101. Subsequently, the pump 103 is operated and the cleaning fluid 102 is circulated between the cleaning bath 101 and the conduits 104, 105. The micro-bubble generating device 1 is operated, and micro-bubbles are generated in the circulated cleaning fluid 102 by the micro-bubble generating mechanism 10. The micro-bubbles are emitted into the widening section 21 of the leading conduit 20 via the nozzle 11 and stabilized. Then, the cleaning fluid 102 including the stabilized small bubble size micro-bubbles are led into the conduit 105 via the tube part 22, and the micro-bubbles are thus supplied into the cleaning bath 101. In the cleaning bath 101, the cleaning fluid 102 is filled with the micro-bubble, and the silicon wafers W are cleaned by the circulated cleaning fluid 102, including the micro-bubbles.

In the silicon wafer cleaning apparatus 100 provided with the micro-bubble generating device 1 according to the first embodiment of the present invention mentioned above, since micro-bubbles of small bubble size having a high cleaning efficiency are supplied to the cleaning bath 101, the cleaning efficiency thereof is high, whereby the silicon wafer W can be cleaned to a high degree, and the cleaning performance for the silicon wafer is enhanced.

Since the micro-bubble generating device 1 is small, as mentioned above, the flexibility of its location with respect to the silicon wafer cleaning apparatus 100 is high, and the design flexibility of the silicon wafer cleaning apparatus 100 can be enhanced. Further, the silicon wafer cleaning apparatus 100 can be miniaturized, whereby usage and movement thereof can be facilitated, and handling thereof can be facilitated.

Subsequently, other embodiments of the micro-bubble generating device according to the present invention will be described. Hereinafter, only different parts from the micro-bubble generating device 1 according to the first embodiment of the present invention mentioned above will be described, the same reference symbols are given to the same parts and the description will be omitted.

Figure 3:
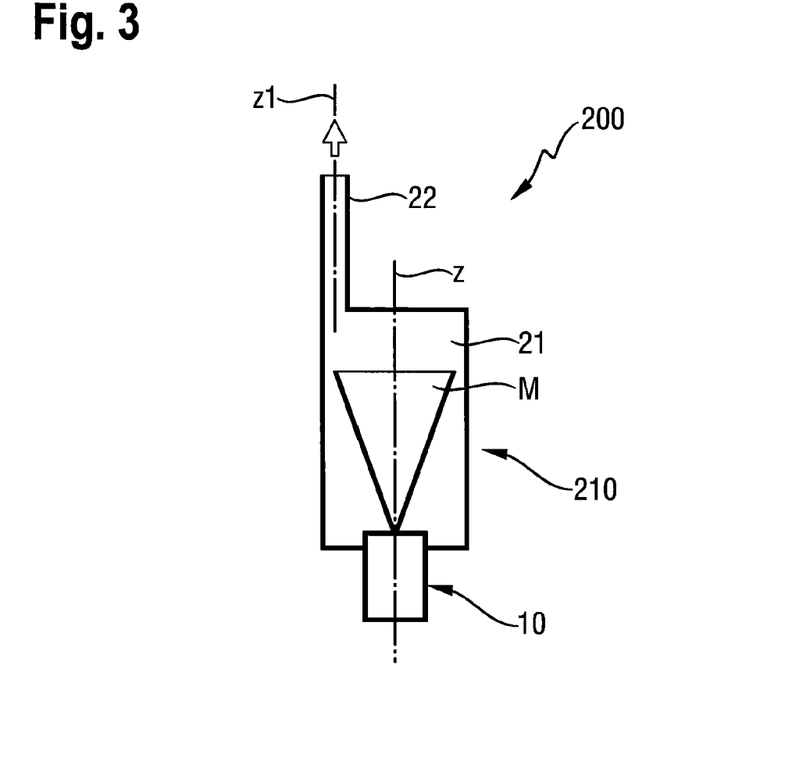
FIG. 3 illustrates a schematic configuration of a micro-bubble generating device according to a second embodiment of the present invention.

FIG. 3 illustrates a schematic configuration of a micro-bubble generating device according to a second embodiment of the present invention. A micro-bubble generating device 200 according to the second embodiment of the present invention differs only in the structure of the leading conduit as compared to the micro-bubble generating device 1.

As illustrated in FIG. 3, in the micro-bubble generating device 200, a leading conduit 210 differs in a connecting location with the tube part 22 on the widening section 21. In the leading conduit 210, the tube part 22 is provided in a manner that the flow passage axis z1 thereof is not the same as the flow passage axis Z of the micro-bubble M in the widening section 21 and is shifted in parallel.

In the micro-bubble generating device 1 according to the first embodiment, since the flow passage axis (axis Z) of the conduit 22 is identical to the flow passage axis (axis Z) of the micro-bubble in the widening section 21 and the inlet opening of the conduit 22 is located in the micro-bubble emission direction of the nozzle 11 of the micro-bubble generating mechanism 10, in the case of a vortex flow being generated in the widening section 21, a passage of air is formed in the center of the vortex flow, and the bubble size may become large by this air. On the other hand, in the micro-bubble generating device 200 according to the second embodiment, the flow passage axis z1 of the tube part 22 is offset in parallel with the flow passage axis Z of the micro-bubble M in the widening section 21. Therefore, the generation of the vortex flow in the widening section 21 can be prevented, and micro-bubbles having small bubble size can be supplied more efficiently into the tube part 22. This embodiment is effective particularly in the micro-bubble generating mechanism 10 which uses a micro-bubble generating method in which vortex flow is generated. Micro-bubble generating methods in which vortex flow is generated include swirling liquid flow type, static mixer type, or a combination of the centrifugal pump and the swirling flow type micro-bubble generator.

FIGS. 4 to 7 illustrate schematic configurations of micro-bubble generating devices according to third to sixth embodiments of the present invention, respectively.

Figure 4:
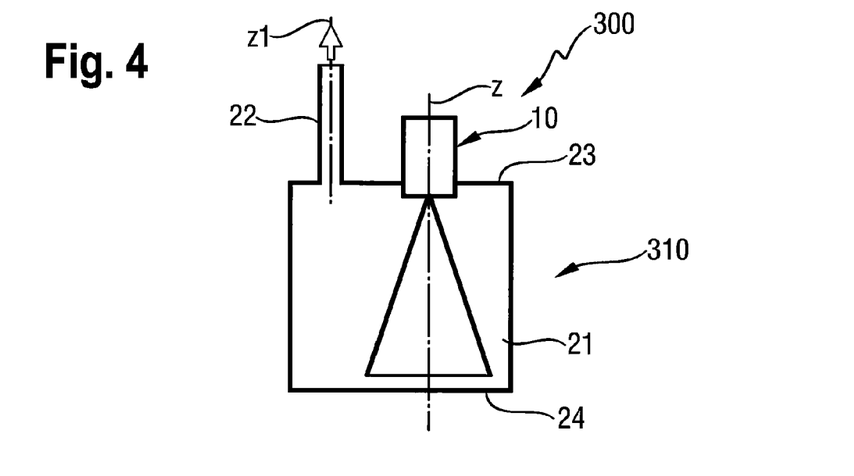
FIG. 4 illustrates a schematic configuration of a micro-bubble generating device according to a third embodiment of the present invention.

A micro-bubble generating device 300 according to the third embodiment of the present invention differs only in the structure of the leading conduit as compared to the micro-bubble generating device 1. As illustrated in FIG. 4, in the micro-bubble generating device 300, a leading conduit 310 differs in a connecting location of the tube part 22 on the widening section 21. In the leading conduit 310, the flow passage axis z1 of the tube part 22 is not identical to the flow passage axis Z of the micro-bubble M in the widening section 21 and is shifted in parallel, and the tube part 22 is connected on the base surface 23 to which the micro-bubble generating mechanism 10 is connected in the widening section 21. With this configuration, the flow direction of the micro-bubbles in the widening section 21 and the flow direction of the micro-bubbles in the tube part 22 become opposed.

Figure 5:
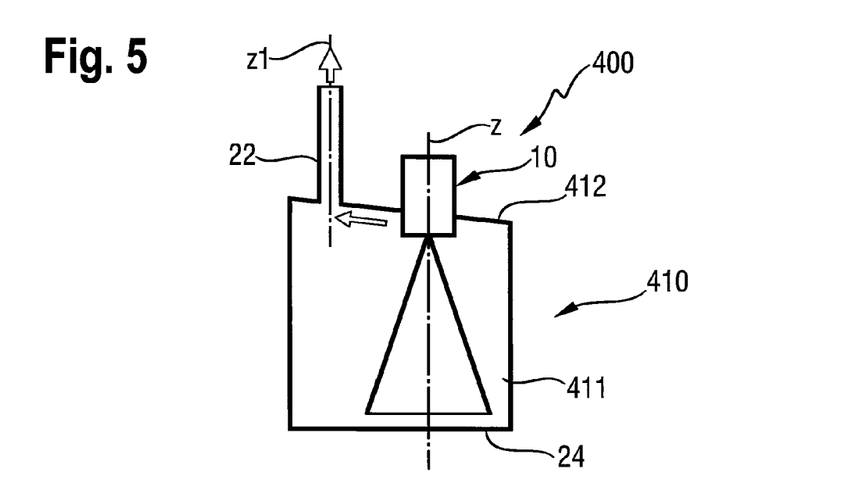
FIG. 5 illustrates a schematic configuration of a micro-bubble generating device according to a fourth embodiment of the present invention.

A micro-bubble generating device 400 according to a fourth embodiment of the present invention differs only in the structure of the leading conduit as compared to the micro-bubble generating device 300. As illustrated in FIG. 5, in the micro-bubble generating device 400, a leading conduit 410 differs in the shape of the widening section 411. In the leading conduit 410, a base end surface 412 to which the micro-bubble generating mechanism 10 and the tube part 22 are connected is not orthogonal to the flow passage axes Z and Z1 in the widening section 411. The widening section 411 is formed in a manner that the base surface 412 gradually diverges from the base surface 24 facing the base surface 412 from the connecting location of the micro-bubble generating mechanism 10 toward the direction of the connecting location of the tube part 22.

Figure 6:
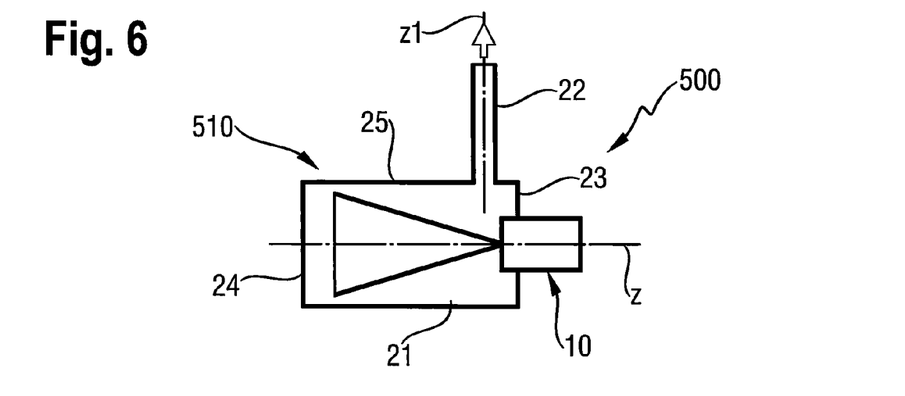
FIG. 6 illustrates a schematic configuration of a micro-bubble generating device according to a fifth embodiment of the present invention.

A micro-bubble generating device 500 according to a fifth embodiment of the present invention differs only in the structure of the leading conduit as compared to the micro-bubble generating device 1. As illustrated in FIG. 6, in the micro-bubble generating device 500, a leading conduit 510 differs in a connecting location of the tube part 22 on the widening section 21. In the leading conduit 510, the flow passage axis z1 of the tube part 22 is not identical to the flow passage axis Z of the micro-bubble M in the widening section 21, and are orthogonal to each other. That is, the tube part 22 is erected on the cylindrical peripheral surface 25 of the widening section 21. The tube part 22 is erected on an edge part at the base surface 23 side in the present embodiment. The flow direction of the micro-bubbles in the widening section 21 and the flow direction of the micro-bubbles in the tube part 22 are orthogonal to each other in this configuration. It should be noted, that although the tube part 22 is connected on the side of the base surface 23 to which the micro-bubble generating mechanism 10 is connected in the widening section 21, the tube part 22 may be provided on the side of the base surface 24.

Figure 7:
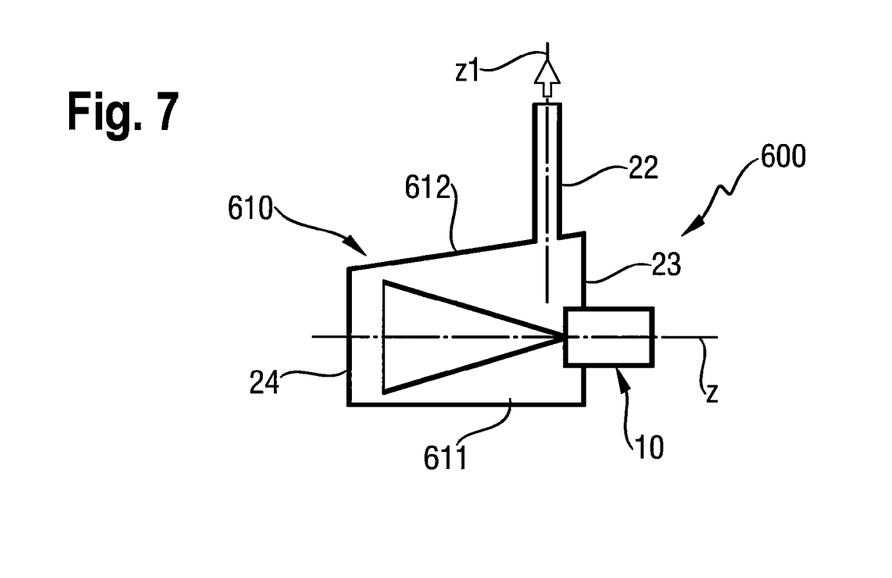
FIG. 7 illustrates a schematic configuration of a micro-bubble generating device according to a sixth embodiment of the present invention.

A micro-bubble generating device 600 according to a sixth embodiment of the present invention differs only in the structure of the leading conduit as compared to the micro-bubble generating device 500. As illustrated in FIG. 7, in the micro-bubble generating device 600, a leading conduit 610 differs in the shape of the widening section 611. In the leading conduit 610, the widening section 611 is not cylindrical on a peripheral surface 612 to which the tube part 22 is connected, and is formed so that the flow passage area decreases from the base surface 23 to which the micro-bubble generating mechanism 10 is connected toward the base surface 24 opposed to the base surface 23. That is, as illustrated in FIG. 7, the peripheral surface 612 of the widening section 611 forms a nearly circular truncated-cone peripheral surface, and the widening section 611 is formed so that the cross section in alignment with the flow passage axis Z becomes a trapezoidal shape. This is for the sake of making the bubbles hard to collect in the widening section 611.

The micro-bubble generating devices 300 to 600 according to the third to the sixth embodiments of the present invention mentioned above can achieve an effect identical to the micro-bubble generating device 200 according to the second embodiment of the present invention mentioned above.

Figure 8:
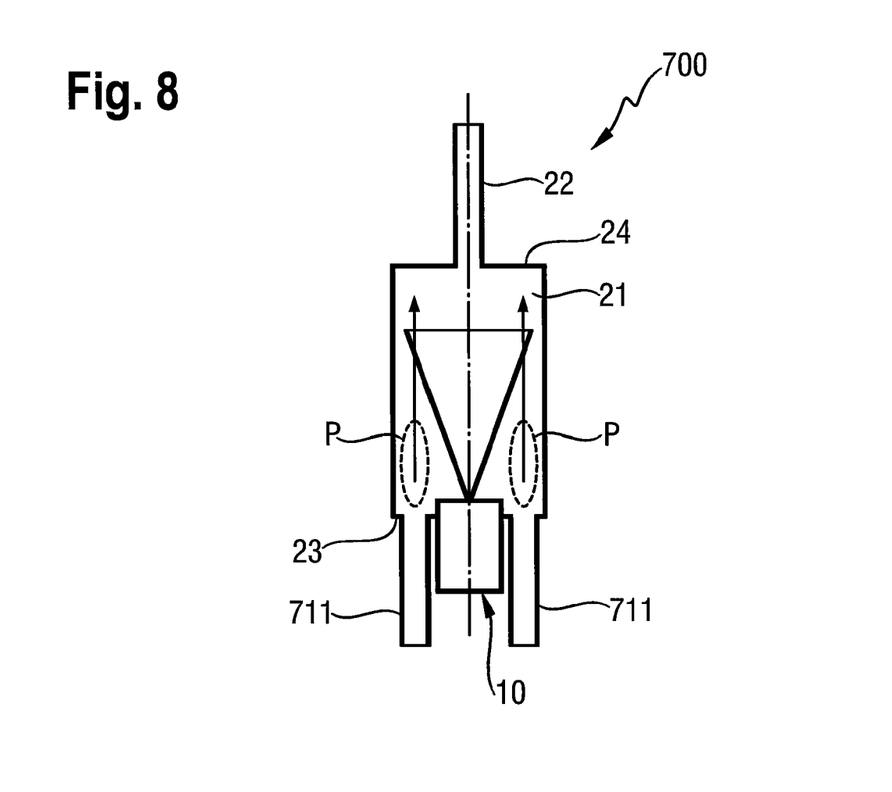
FIG. 8 illustrates a schematic configuration of a micro-bubble generating device according to a seventh embodiment of the present invention.

FIG. 8 illustrates a schematic configuration of a micro-bubble generating device according to a seventh embodiment of the present invention. A micro-bubble generating device 700 according to the seventh embodiment of the present invention differs only in a structure of a leading conduit as compared to the micro-bubble generating device 1.

As illustrated in FIG. 8, in the micro-bubble generating device 700, the leading conduit 710 differs in that supplying conduits 711 supplying a fluid in the widening section 21 are connected to the base surface 23 to which the micro-bubble generating mechanism 10 is connected to the widening section 21. In the present embodiment, although two supplying conduits 711 are provided at an edge part of the base surface 23, the number of the supplying conduits 711 is not limited.

In the micro-bubble generating device 700 according to the seventh embodiment of the present invention, since the supplying conduits 711 supplying the fluid in the widening section 21 are provided at the edge part of the base surface 23 to which the micro-bubble generating mechanism 10 is connected, in the widening section 21, therefore, the fluid in an area (area p) near the edge part of the base surface 23 in the widening section 21 is made to flow, and the fluid in the area p can be prevented from stagnating.

Figure 9:
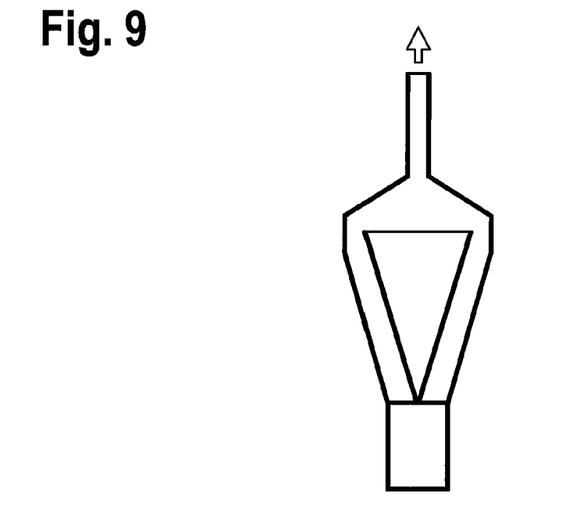
FIG. 9 illustrates a modification of the micro-bubble generating device of FIG. 1.
Figure 10:
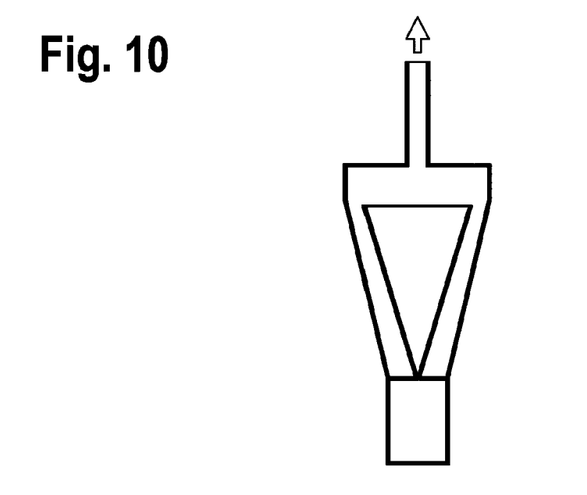
FIG. 10 illustrates a further modification of the micro-bubble generating device of FIG. 1.

The micro-bubble generating device according to the present invention is not limited to the shape or the configuration of the micro-bubble generating device according to each embodiment of the present invention mentioned above, and may be a combination of each embodiment, for example. The shape of the widening section 21 of the micro-bubble generating device 1, as illustrated in FIG. 9, may be a hollow conical shape (circular truncated cone shape) expanding in the flowing direction of the micro-bubble with the flow passage axis Z as the central axis, and as illustrated in FIG. 10, may be a shape expanding in the flowing direction of the micro-bubble with the flow passage axis Z as the central axis, and narrowing again from a predetermined position. The tube part 22 may be disposed so that the flow passage axis z1 is not orthogonal to the flow passage axis Z of the widening section and crosses in a slant to the flow passage axis Z.

The direction of installation of the micro-bubble generating device according to the present invention is not limited to the direction illustrated in FIGS. 1 and 3 to 10. But it is more desirable for the tube part 22 to be in the upper side as much as possible, in order that the bubbles are more easily removed from the widening section 21. For example, the direction of installation may be the direction in which the micro-bubble generating devices illustrated in FIGS. 4 and 5 have been rotated by 90 degrees to the right, and in which the micro-bubble generating devices illustrated in FIGS. 6 and 7 have been rotated by 90 degrees to the left.

There is no limit in particular also with regard to a material of the micro-bubble generating devices according to the present invention.

The micro-bubble generating devices according to the present invention may be applied to cleaning apparatuses such as a parts of soaping machines, washing machines, etc. other than the silicon wafer cleaning apparatus. The micro-bubble generating devices according to the present invention may be installed in a bathtub, a fish preserve, a cistern of an aquarium, or a fish tank. In this case, for example, it is possible to be connected to a circulation passage of a circulation filtration filter. It may be provided in a midway of a hose or water pipe of a home shower.

Specifically, the micro-bubble generating devices according to the present invention are applicable in an alkaline cleaning fluid having an etching capability.

It is known that an etching rate in an alkaline cleaning fluid having an etching capability will be improved with the use of micro-bubbles (see Japanese Unexamined Patent Application Publication No. 2008-103701). With the silicon wafer cleaning apparatus 100 comprising the micro-bubble generating device according to the present invention, the etching rate can be enhanced like a conventional silicon wafer cleaning apparatus with a conventional micro-bubble generating device located in the cleaning bath thereof.

EXAMPLE

First, a sample for evaluation was made by depositing a polysilicon layer on a mirror surface of a silicon wafer of 200 mm in diameter, the layer being approximately 1 μm in thickness (by CVD). Subsequently, the thickness of the polysilicon layer of the sample before cleaning was measured using NanoSpec (Nanometrics Corporation).

Figure 11:
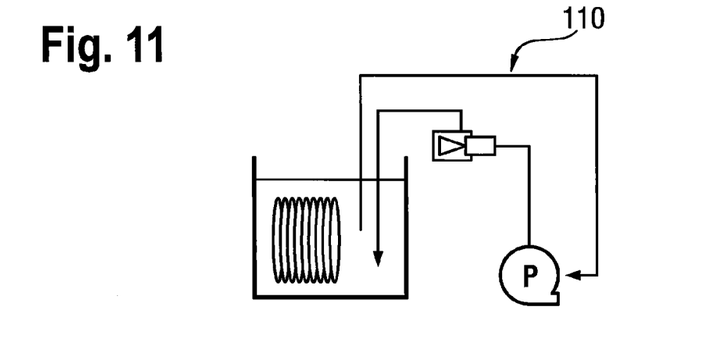
FIG. 11 illustrates the silicon wafer cleaning apparatus of Example 1.

Subsequently, as illustrated in FIG. 11, the above-mentioned sample was cleaned using the silicon wafer cleaning apparatus 110 (Example 1). The silicon wafer cleaning apparatus 110 is one in which the micro-bubble generating device 500 of the type illustrated in FIG. 6 was used in the silicon wafer cleaning apparatus 100 of FIG. 2 as the micro-bubble generating device. As for the micro-bubble generating mechanism 10, the swirling liquid flow type (M2-MS/PTFE type made by Nanoplanet Research Institute Corporation) was used. The widening section was made from quartz glass having a shape in which the diameter is 100 mm and the length is 200 mm. In the cleaning treatment, specifically, as a cleaning fluid in the cleaning bath 101, an alkaline cleaning fluid having an etching capability, for example, Techniclean 200EF (principal components: an alkaline inorganic salt, an anionic surfactant, a nonionic surfactant, water) diluted 20 times with ultrapure water was used. The used cleaning fluid was disposed of for every cleaning treatment, and the new cleaning fluid was used. The above-mentioned cleaning fluid of 20 L (liter) was poured into the cleaning bath 101, the temperature of the cleaning fluid was set to 50° C., and the sample was soaked for 30 minutes in this cleaning fluid. After that, the cleaned sample was taken out, and put into a 20° C. ultrapure water tank, and a rinse treatment was performed for 10 minutes. Then, this sample was dried with a spin dryer.

Subsequently, with respect to the sample of Example 1 for which the cleaning treatment was performed as mentioned above, the thickness of the poly silicon layer of the sample was measured like the measurement before cleaning.

Figure 12:
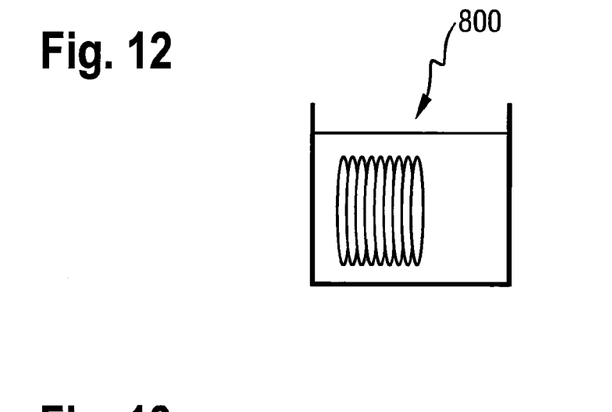
FIG. 12 illustrates the silicon wafer cleaning apparatus of Comparative Example 1.

As illustrated in FIG. 12, with a silicon wafer cleaning apparatus 800 which does not have a micro-bubble generating device, the above-mentioned sample was cleaned (Comparative Example 1). That is, the cleaning treatment was one in which micro-bubbles were not used and the cleaning fluid did not circulate.

Figure 13:
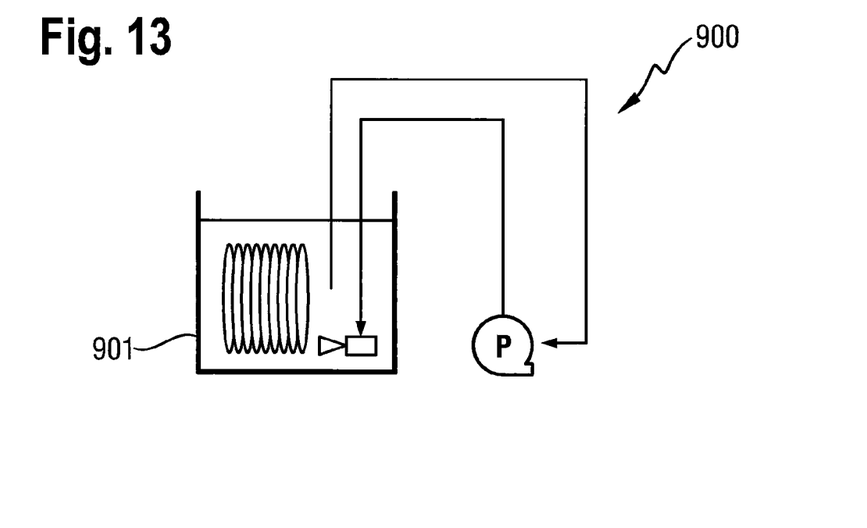
FIG. 13 illustrates the silicon wafer cleaning apparatus of Comparative Example 2.

As illustrated in FIG. 13, with a silicon wafer cleaning apparatus 900 in which a single nozzle part of a micro-bubble generating device (M2-MS/PTFE type made by Nanoplanet Research Institute Corporation) was disposed on a base surface of a cleaning bath 901, the above-mentioned sample was cleaned (Comparative Example 2).

Figure 14:
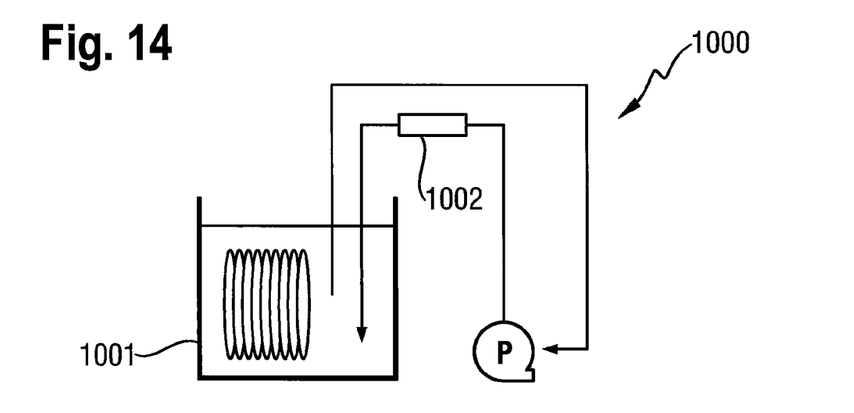
FIG. 14 illustrates a silicon wafer cleaning apparatus of Comparative Example 3.
Figure 15:
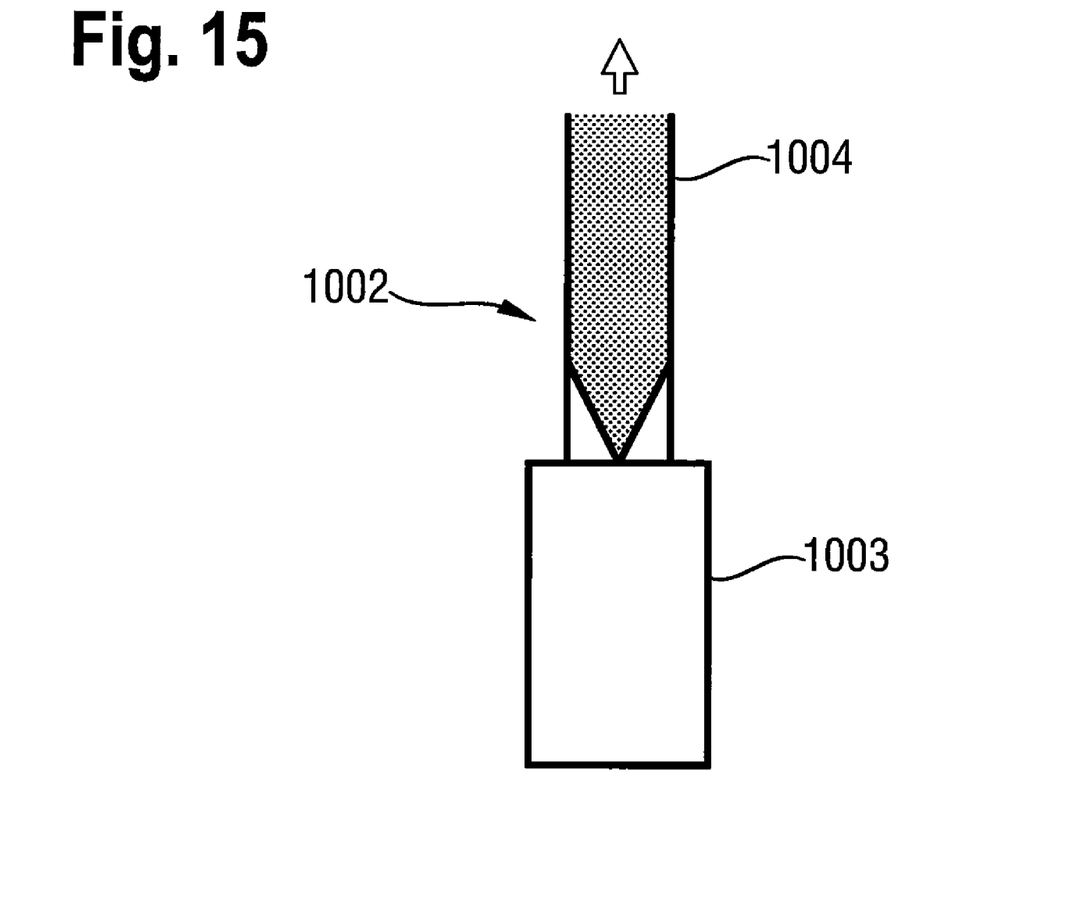
FIG. 15 illustrates a micro-bubble generating device of the silicon wafer cleaning apparatus of FIG. 14.

As illustrated in FIG. 14, a Teflon™ (PFA) tube 1004 having a outer diameter of ¾ inch and a inner diameter of ⅝ inch was connected directly to a micro-bubble nozzle of a micro-bubble generating mechanism 1003 of a micro-bubble generating device 1002 (see FIG. 15), and with a silicon wafer cleaning apparatus 1000 in which the Teflon tube 1004 was introduced into a cleaning bath 1001, the above-mentioned sample was cleaned (Comparative Example 3).

The cleaning treatment in the Comparative Examples 1 to 3, i.e., a cleaning bath, a cleaning fluid composition, an amount of cleaning fluid, a cleaning time frame, a rinse treatment time frame, a drying method, or the like, are the same as those of the above-mentioned Example 1. The sample after cleaning was measured like Example 1.

The etching rate was calculated from the thickness of the polysilicon layer before and after cleaning which was acquired by measuring the sample of Example 1 and the samples of the Comparative Examples 1 to 3. The results are shown in Table 1. In Table 1, Liquid Flow Amount is the flow rate of the cleaning fluid introduced into the micro-bubble generating device. Introduced Air Quantity is the flow rate of the air introduced into the micro-bubble generating device.

TABLE 1

| | MICRO-BUBBLE | LIQUID FLOW AMOUNT (LITER/MINUTE) | INTRODUCED AIR QUANTITY (LITER/MINUTE) | ETCHING RATE (NM/MINUTE) |
|---|---|---|---|---|
| Comparative Example 1 | NONE | | | 0.84 |
| Comparative Example 2 | SOAK IN BATH | 8.0 | 0.3 | 1.63 |
| Comparative Example 3 | INLINE (¾-INCH TUBE DIRECT CONNECTION) | 7.5 | 0.1 | 0.89 |
| Example 1 | INLINE (APPARATUS OF THE PRESENT INVENTION IS CONNECTED) | 7.5 | 0.1 | 1.36 |

As illustrated in Table 1, in the silicon wafer cleaning apparatus according to the present invention (Example 1), provides an enhancement in the etching rate equivalent to the conventional silicon wafer cleaning apparatus (Comparative Example 2) in which a conventional micro-bubble generating device is located in the cleaning bath is acquired. That is, it turns out that the silicon wafer cleaning apparatus according to the present invention (Example 1) can generate microbubbles effectively.

Although the Example 1 is slightly lower than the Comparative Example 2 in the etching rate, it is considered that this is influenced by the fact that the Example 1 air introduction quantity is lower than that of Comparative Example 2. Therefore, it is considered that the Example 1 has a microbubble generating capability almost equivalent to the Comparative Example 2.

In the Comparative Example 3 in which the Teflon tube is connected directly to the micro-bubble nozzle of the micro-bubble generating mechanism, a vortex flow was produced, and large bubbles were generated since the Teflon tube was too fine. A significant enhancement in the etching rate was not found as compared with the Comparative Example 1 without the micro-bubble.

Thus, in the silicon wafer cleaning apparatus according to the present invention, a removing capability of various contaminants (particles, ions, metals, organic substances, and the like) on a surface of the silicon wafer can be enhanced to the extent equivalent to a conventional silicon wafer cleaning apparatus in which a conventional micro-bubble generating device is located in the cleaning bath.

DESCRIPTION OF NUMERALS

| | |
|---|---|
| 1, 200, 300, 400, 500, 600, 700: | Micro-bubble Generating Device |
| 10: | Micro-bubble Generating Mechanism |
| 11: | Nozzle |
| 20, 210, 310, 410, 510, 610: | Leading Conduit |
| 21, 411, 611: | Widening Section |
| 22: | Tube Part |
| 23, 24, 412: | Base Surface |
| 25, 612: | Peripheral Surface |
| 100: | Silicon Wafer Cleaning Apparatus |
| 101: | Cleaning Bath |
| 102: | Cleaning Fluid |
| 103: | Pump |
| 104, 105: | Conduit |
| 711: | Supplying Conduit |
| Z, Z1: | Axis |

-continued

DESCRIPTION OF NUMERALS

| | |
|---|---|
| M: | Micro-bubble |
| W: | Silicon Wafer |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A micro-bubble generating and stabilizing device, comprising:
   a) a micro-bubble generating mechanism into which gas and liquid flow, generating gas micro-bubbles and having an exit nozzle;
   b) a leading conduit having a widening section into which microbubbles entrained in liquid are directly introduced from said exit nozzle, and a tube part, wherein the widening section is larger in flow passage cross-sectional area than the tube part, thereby configured to stabilize the generated microbubbles.

2. The micro-bubble generating and stabilizing device of claim 1, wherein the micro-bubble generating mechanism and the tube part are connected to the widening section so that a flow axis of micro-bubbles in the widening section and a flow axis of the micro-bubbles in the tube part extend in the same direction.

3. The micro-bubble generating and stabilizing device of claim 1, wherein a flow direction of micro-bubbles in the widening section and a flow direction of micro-bubble in the tube part are opposed.

4. The micro-bubble generating and stabilizing device of claim 1, wherein the micro-bubble generating mechanism and the tube part are connected to the widening section so that the flow axis of the micro-bubbles in the widening section and the flow axis of the micro-bubbles in the tube part cross.

5. The micro-bubble generating and stabilizing device of claim 4, wherein the micro-bubble generating mechanism and the tube part are connected to the widening section so that the flow passage axis in the widening section and the flow passage axis in the tube part are orthogonal.

6. The micro-bubble generating and stabilizing device of claim 1, wherein the micro-bubble generating mechanism is connected to the widening section so that the nozzle deviates from a flow axis of the micro-bubbles in the tube part.

7. The micro-bubble generating and stabilizing device of claim 1, wherein the widening section has a circular flow passage cross section.

8. The micro-bubble generating and stabilizing device of claim 1, wherein the tube part is provided near the nozzle in the widening section.

9. A silicon wafer cleaning apparatus for cleaning silicon wafers, comprising:
   a) a cleaning bath accommodating the silicon wafer to be cleaned and containing a cleaning fluid;
   b) a micro-bubble generating and stabilizing device of claim 1; and
   c) a pump device having a pump and a conduit circulating the cleaning fluid in the cleaning bath, wherein the micro-bubble generating and stabilizing device is provided in the conduit of the pump device.

* * * * *